United States Patent
Fine et al.

(10) Patent No.: US 7,331,007 B2
(45) Date of Patent: Feb. 12, 2008

(54) HARNESSING MACHINE LEARNING TO IMPROVE THE SUCCESS RATE OF STIMULI GENERATION

(75) Inventors: Shai Fine, Ra'anana (IL); Ari Freund, Haifa (IL); Itai Jaeger, Lavon (IL); Yehuda Naveh, Haifa (IL); Avi Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 298 days.

(21) Appl. No.: 11/177,127

(22) Filed: Jul. 7, 2005

(65) Prior Publication Data

US 2007/0011631 A1   Jan. 11, 2007

(51) Int. Cl.
*G06F 11/00*   (2006.01)
*G06F 17/50*   (2006.01)

(52) U.S. Cl. .............................. 714/741; 716/4; 703/13
(58) Field of Classification Search ...................... None
See application file for complete search history.

(56) References Cited

U.S. PATENT DOCUMENTS

| | | | | |
|---|---|---|---|---|
| 5,469,530 | A * | 11/1995 | Makram-Ebeid | 706/25 |
| 6,356,858 | B1 | 3/2002 | Malka et al. | |
| 7,139,955 | B2 * | 11/2006 | Rohrbaugh et al. | 714/738 |
| 7,168,021 | B2 * | 1/2007 | Chen | 714/733 |

OTHER PUBLICATIONS

Raanan Grinwald et al., "User Defined Coverage—A Tool Supported Methodology for Design Verification", Proc. 38th Design Automation Conference (DAC38), pp. 158-163, 1998.

E. Bin et al., "Using a Constraint Satisfaction Formulation and Solution Techniques for Random Test Program Generation," IBM Systems Journal, 41(3):386-402, 2002.

Allon Adir et al., "Adaptive Test Program Generation: Planning for the Unplanned", 2002 IEEE, pp. 83-88.

Shai Fine et al., "Coverage Directed Test Generation for Functional Verification using Bayesian Networks", Proceedings of the 40th Design Automation Conference, pp. 286-291, Jun. 2003.

Oded Lachish et al., "Hole Analysis for Functional Coverage Data", Proceedings of the 39th Design Automation Conference, pp. 806-811, Jun. 2002.

Allon Adir et al., "Genesys-Pro: Innovations in Test Program Generation for Functional Processor Verification," IEEE Design and Test of Computers, 21(2):84-93, 2004.

Finn V. Jensen, *Bayesian Networks and Decision Graphs*, in series "Statistics for Engineering and Information Science", Springer-Verlag New York 2001, especially Chapter 3 pp. 79-107.

Robert G. Cowell et al., *Probabilistic Networks and Expert Systems*, in series "Statistics for Engineering and Information Science", Springer-Verlag New York 1999, especially Chapter 9, sections 9.3-9.6, pp. 192-204.

* cited by examiner

*Primary Examiner*—Christine T. Tu

(57) ABSTRACT

Test generation is improved by learning the relationship between an initial state vector for a stimuli generator and generation success. A stimuli generator for a design-under-verification is provided with information about the success probabilities of potential assignments to an initial state bit vector. Selection of initial states according to the success probabilities ensures a higher success rate than would be achieved without this knowledge. The approach for obtaining an initial state bit vector employs a CSP solver. A learning system is directed to model the behavior of possible initial state assignments. The learning system develops the structure and parameters of a Bayesian network that describes the relation between the initial state and generation success.

20 Claims, 3 Drawing Sheets

HARNESSING MACHINE LEARNING TO IMPROVE THE SUCCESS RATE OF STIMULI GENERATION

BACKGROUND OF THE INVENTION

1. Field of the Invention

This invention relates to functional design verification. More particularly, this invention relates to the generation of an initial state of a design under verification (DUV) in order to produce subsequent transactions for use in verifying the design and to enhance their quality.

2. Description of the Related Art

Functional verification is widely acknowledged to be a bottleneck in the hardware design cycle. Indeed, up to 70% of design development time and resources are typically spent on functional verification. Allowing users to find design flaws, and fixing them in a subsequent release would be unwise and costly for three main reasons: (1) harm to reputation and brand-name; (2) a high cost of recall and replacement when there is a large installed base; and (3) litigation in the event that design flaws caused injury.

In current industrial practice, dynamic verification is the main functional verification technique for large and complex designs. Dynamic verification is accomplished by generating a large number of tests using random test generators, simulating the tests on the design-under-verification, and checking that the design-under-verification behaves according to its specification.

The rationale behind verification by simulation is that one acquires confidence in the correctness of a design-under-verification by running a set of test cases that encompass a sufficiently large number of different cases, which in some sense is assumed to be a representative sample of the full space of possible cases. The ability of the design-under-verification to correctly handle all cases is inferred from the correct handling of the cases actually tested. This approach is discussed, for example, in the document *User Defined Coverage—A Tool Supported Methodology for Design Verification,* Raanan Grinwald, Eran Harel, Michael Orgad, Shmuel Ur, and Avi Ziv, Proc. 38$^{th}$ Design Automation Conference (DAC38), pp 158-163, 1998. When conducting simulations, it is desirable to define a particular subspace, which is considered to be interesting in terms of verification, and then to generate tests selected at random that cover the subspace.

The term "coverage" concerns checking and showing that testing has been thorough. Coverage is any metric of completeness with respect to a test selection criterion for the design-under-verification. Simply stated, the idea is to create in some systematic fashion a large and comprehensive list of tasks, and check that in the testing phase each task was executed.

The need to create a wide spread of behaviors in the DUV exists whether explicit coverage models exist or not. In that sense, one of the requirements from random stimuli generators is to create test cases that cover well the space of possible stimuli that meet user requirements (see the document *Using a Constraint Satisfaction Formulation and Solution Techniques for Random Test Program Generation,* E. Bin, R. Emek, G. Shurek, and A. Ziv, IBM Systems Journal, 41(3):386-402, 2002). This requirement holds even if there are no explicit coverage models defined on the generated stimuli.

In recent years, technology has shifted towards constraint-based modeling of the generation task and generation schemes driven by solving constraint satisfaction problems (CSP), as described in the document *Using a Constraint Satisfaction Formulation and Solution Techniques for Random Test Program Generation,* E. Bin, R. Emek, G. Shurek, and A. Ziv, IBM Systems Journal, 41(3):386-402, 2002. Validity of the stimuli, their quality, and test specification requirements are naturally modeled through constraints. For CSP to drive stimuli generation, the stimuli, or their building blocks, are modeled as constraint networks. A random stimuli generator can, therefore, be viewed as a CSP solver.

The constraint network resulting from a model of the entire stimuli is, in most cases, too large and complex for CSP solvers to handle. Therefore, most stimuli generators break the constraint network into smaller, loosely coupled networks and solve each of the smaller networks separately, as explained in the above-noted document *Using a Constraint Satisfaction Formulation and Solution Techniques for Random Test Program Generation,* and further in the document *X-Gen: A Random Test-Case Generator for Systems and SoCs,* R. Emek, I. Jaeger, Y. Naveh, G. Bergman, G. Aloni, Y. Katz, M. Farkash, I. Dozoretz, and A. Goldin, in IEEE International High Level Design Validation and Test Workshop, pp 145-150, October 2002. More precisely, the stimuli are broken into a sequence of transactions, and each transaction is generated separately, such that the solution for a subsequent transaction is affected by the state of the system as determined either by initializations or by previous transactions.

For complexity reasons, most stimuli generators use sequential solutions without planning ahead, i.e., considering the requirements of subsequent transactions when solving the constraint network of the current transaction. Therefore, in many cases they fail to find consistent stimuli because of a bad selection of the initial state.

SUMMARY OF THE INVENTION

One solution to this problem is for the user to provide a favorable initial state to the stimuli generator. This solution has many drawbacks. First, it may not be easy for the user to find such an initial state. In addition, using one specific initial state reduces the randomness of the generated test. Finally, this favorable initial state may be sensitive to changes in the design-under-verification, and thus may need to be updated often.

The optimum solution would be to infer automatically the exact relation between the initial state and the generation success of all subsequent transactions in a test, but this is often very difficult and time consuming, if not impossible.

According to disclosed embodiments of the invention, test generation is improved by learning the relationship between initial state vectors and generation success. A stimuli generator for a design-under-verification is provided with information about the success probabilities of potential assignments to an initial state bit vector. Selection of initial states according to the success probabilities ensures a higher success rate than would be achieved without this knowledge.

The method for obtaining the initial state bit vector employs a CSP solver, without need to modify existing CSP algorithms or the sequential solution scheme of the stimuli generator. A learning system is directed to model the behavior of possible initial state assignments. The learning system develops the structure and parameters of a Bayesian network that describes the relation between the initial state and generation success. It does so in several steps. First, it identifies bits in the state vector that are relevant to the generation success. Second, it learns the feasible space, that is the assignments for the relevant bits that are permissible as initial assignments. This step is important because the feasible space can be small compared to the entire space of assignments, and learning should be targeted at the feasible area. Third, it learns the relation between the feasible initial assignments and generation success.

The invention provides a method for functional verification of a design, which is carried out by identifying a feasible space of initial state vectors that can enable generation of stimuli for the design, sampling the feasible space to obtain a sample pool of initial state vectors, generating test stimuli to stimulate the design using respective members of the sample pool, evaluating results of an application of the test stimuli. Responsively to the evaluation of results, the method is further carried out by establishing a subspace of the feasible space that includes favorable initial state vectors, and selecting new initial state vectors from the subspace for use in generating functional tests for the design.

One aspect of the method includes identifying outcome determinative substructures within the initial state vectors.

In another aspect of the method, identifying outcome determinative substructures is performed by resampling the members of the sample pool.

According to a further aspect of the method, the initial state vectors have structures including a plurality of bits.

Yet another aspect of the method is carried out by grouping the outcome determinative substructures into gates, and creating a statistical model from the gates that correlates the result evaluation with initial states of the gates.

According to still another aspect of the method, the statistical model is a Bayesian network.

According to yet another aspect of the method, the initial state vectors comprise state vectors that are assigned at a point in a generation sequence subsequent to a beginning of the sequence.

According to still another aspect of the method, the feasible space of initial state vectors includes a space of user requests.

The invention provides a computer software product, including a computer-readable medium in which computer program instructions are stored, which instructions, when read by a computer, cause the computer to perform a method for functional verification of a design, which is carried out by identifying a feasible space of initial state vectors that can enable generation of stimuli for the design, sampling the feasible space to obtain a sample pool of initial state vectors, generating test stimuli to stimulate the design using respective members of the sample pool, evaluating results of an application of the test stimuli. Responsively to the evaluation of results, the method is further carried out by establishing a subspace of the feasible space that includes favorable initial state vectors, and selecting new initial state vectors from the subspace for use in generating functional tests for the design.

The invention provides a verification system for functional verification of a design, including a random test generator, a constraint satisfaction problem engine, which is cooperative with the random test generator to perform the steps of identifying a feasible space of initial state vectors that can enable generation of stimuli for the design, sampling the feasible space to obtain a sample pool of initial state vectors, and using respective members of the sample pool, and generating test stimuli to stimulate the design. The system further includes an execution engine for stimulating the design using the test stimuli, and a coverage analyzer operative for evaluating results of the execution engine and the constraint satisfaction problem engine. The random test generator is cooperative with the coverage analyzer for establishing a subspace of the feasible space that includes favorable initial state vectors, and selecting new initial state vectors from the subspace for use in generating functional tests for the design.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention unnecessarily.

Software programming code, which embodies aspects of the present invention, is typically maintained in permanent storage, such as a computer readable medium. In a client-server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), digital video discs (DVD's), and computer instruction signals embodied in a transmission medium with or without a carrier wave upon which the signals are modulated. For example, the transmission medium may include a communications network, such as the Internet. In addition, while the invention may be embodied in computer software, the functions necessary to implement the invention may alternatively be embodied in part or in whole using hardware components such as application-specific integrated circuits or other hardware, or some combination of hardware components and software.

System Overview.

Figure 1:
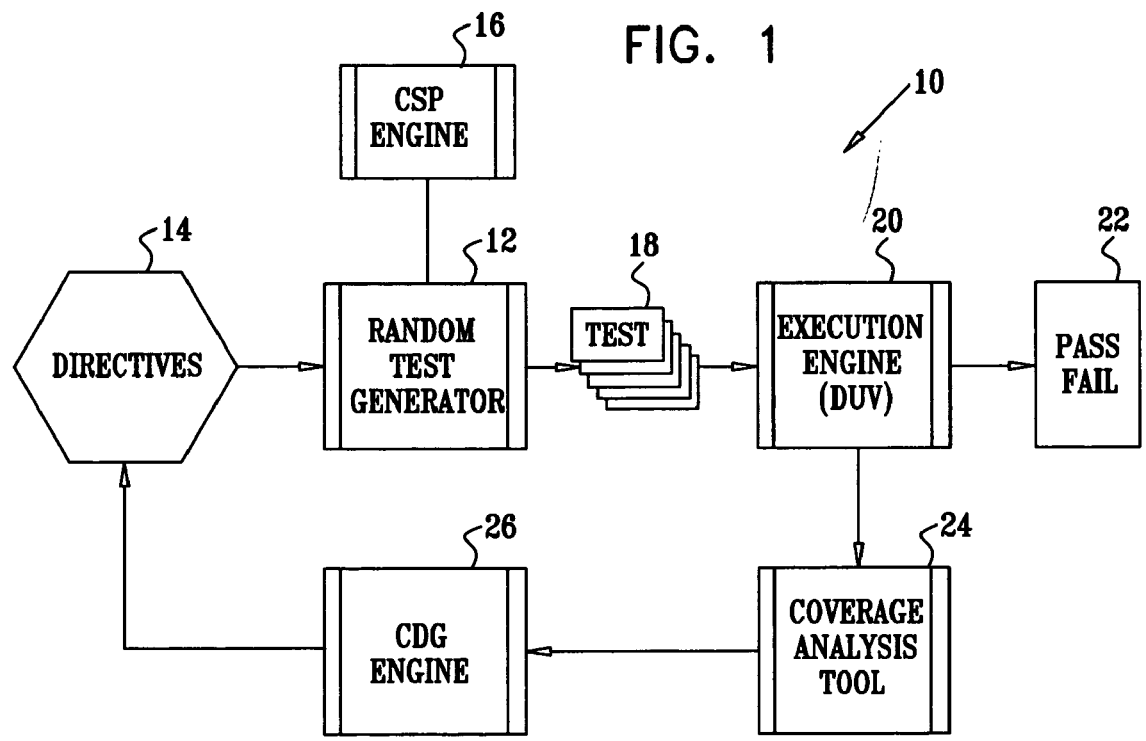
FIG. 1 is a block diagram illustrating a verification system having a stimuli generator that is constructed and operative in accordance with a disclosed embodiment of the invention.

Turning now to the drawings, reference is initially made to FIG. 1, which is a block diagram illustrating a verification system 10 that is constructed and operative in accordance with a disclosed embodiment of the invention. The system 10 enables the creation of test programs that have various degrees of randomness. The ability of the system 10 to introduce random unspecified values is fundamental, since design flaws in practice are usually unpredictable. However, the system 10 typically contains provisions for biasing the test programs toward conditions of interest, for example boundary conditions, or specific byte alignments. The system 10 can be implemented using software executing on a processor, such as a general purpose computer or workstation, and once configured, is capable of automatic operation, without substantial human involvement.

A generic test generator engine 12, also referred to herein as a stimuli generator, is influenced by input directives 14. A CSP engine 16 cooperates with the test generator engine 12, as described hereinbelow. The influence of the input directives 14 includes, for example, the identity of the test instructions generated, their parameters, relative order, and various events relating to the instructions. The input directives 14 may also include an initial state vector for the test generator engine 12. The test generator engine 12 produces a suite of test programs 18, which are then executed on an execution engine 20 as stimuli for the design-under-verification. The execution engine 20 is typically a simulator of a design-under-verification. However, the invention can be practiced in embodiments of the system 10 in which the execution engine 20 is realized as a hardware implementation of the design-under-verification. Following execution of the test programs 18, a test report 22 is issued, indicating the results of the tests.

A coverage analyzer 24 evaluates the coverage provided by the runs of the test programs 18. The coverage analyzer 24 can be the coverage measurement tool for user-defined coverage models, which is disclosed in commonly assigned U.S. Pat. No. 6,356,858.

The results of the coverage analysis performed by the coverage analyzer 24 are provided as feedback to a coverage directed generation (CDG) engine 26, which then automatically modifies the input directives 14 so as to modify the behavior of the test generator engine 12 The modifications are intended to improve the coverage provided by the test programs 18 in a subsequent test run or simulation and to reach the goals of the test plan. More particularly, favorable initial state vectors are included in the modified input directives 14.

Learning System.

A common practice for stimuli generators is to break the stimuli into a sequence of transactions and generate each transaction separately, considering the previously generated transactions but ignoring future transactions. This approach is described in further detail in the document *Using A Constraint Satisfaction Formulation And Solution Techniques For Random Test Program Generation,* E. Bin, R. Emek, G. Shurek, and A. Ziv, IBM Systems Journal, 41(3): 386-402, 2002. The first step is to generate the initial state of the DUV. As noted above, the initial state has a major impact on the ability of the stimuli generator to successfully generate the subsequent transactions, and it is therefore necessary to choose it wisely. Unfortunately, the conventionally configured generator employs no lookahead, and is unable to anticipate which initial states will lead eventually to successful generation, and which to failure.

In one embodiment of the invention, an approximation to the region of favorable initial states is provided, which is essentially a subset of the feasible space, that is the space of all legal assignments to the state vector. This approximation represents a tradeoff between finding the exact region of favorable initial states and randomly selecting an initial value without considering the transaction in the generated stimuli. It allows the stimuli generator to randomly select a favorable initial state with a high probability of achieving good coverage in the resultant tests.

Figure 2:
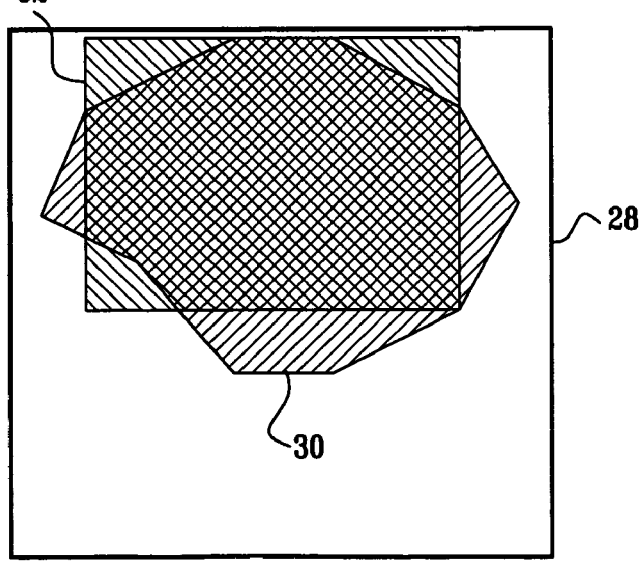
FIG. 2 is a diagram illustrating effects of an approximation to a region of favorable initial states for a stimuli generator in accordance with a disclosed embodiment of the invention.

Reference is now made to FIG. 2, which is a diagram illustrating effects of an approximation to a region of favorable initial states in accordance with a disclosed embodiment of the invention. A universe of feasible initial states is represented by a rectangle 28. A complex shape 30 describes an actual region of favorable initial states, which is approximated by a smaller rectangle 32. The rectangle 32 is constructed by a learning system described in further detail hereinbelow. Choosing initial states from the region of the rectangle 32 has a high probability of yielding good initial states and provides good coverage of the actual region of favorable initial states.

The techniques employed are rooted in the realm of machine learning. In a nutshell, the problem of correctly setting state vector bits is translated into a problem of learning certain Boolean functions. The domain of each Boolean function is an unknown subset of the state vector bits, and the function represents the success and failure dependence of a given transaction on the state vector configuration. To facilitate efficient learning, the following conditional independence assumption is made: given an assignment to the state vector, the generation success of any transaction is independent of any other transaction. It is also assumed that each of the Boolean functions decomposes nicely into a small set of simpler functions, termed gates, each of which is supported, not necessarily exclusively, by a bounded number of bits. Experiments described below bear out this assumption.

The input to the learning system consists of the following items:

1. A set of interesting transactions, rich and comprehensive enough to serve as building blocks for the stimuli desired to be generated.
2. The parts of the state vector that are outcome determinative, i.e., they are the common cause for generation failure of the transactions of interest.
3. An upper bound to the number of bits in the domain of each gate (fan-in).
4. An upper bound to the number of gates that form any of the Boolean functions.
5. A membership query (MQ) oracle capable of producing a correct label indicating success or failure for any transaction, given a possibly incomplete state vector assignment.

In order to successfully prevent failures by setting bits in the state vector, it is necessary to address issues of feature selection (which of the bits in the state vector are outcome determinative, in that they affect generation failure of the transaction) and function approximation (what assignments to these bits lead to generation success). A good learning system should answer these questions while pre-serving maximum freedom, i.e., the learning system should constrain a minimum number of bits in the least restrictive manner, thus maintaining a maximal number of assignments from which to choose.

The approach taken is analysis of a training set of samples, which includes a sufficient amount of labeled data. Each sample consists of a state vector assignment and the corresponding labels (success or failure) for the transactions resulting from the respective assignment.

The analysis is performed in three stages. First, a data correlation search is undertaken in order to discover which bits in the state vector are correlated with the label. Next, the structural forms of the functions constituting the learned system are identified. Finally, a statistical model is constructed, which associates all possible state vector assignments with success/failure results. In the current embodiments, all three steps are automated. The stimuli generator itself is used as the MQ oracle to provide label results.

Figure 3:
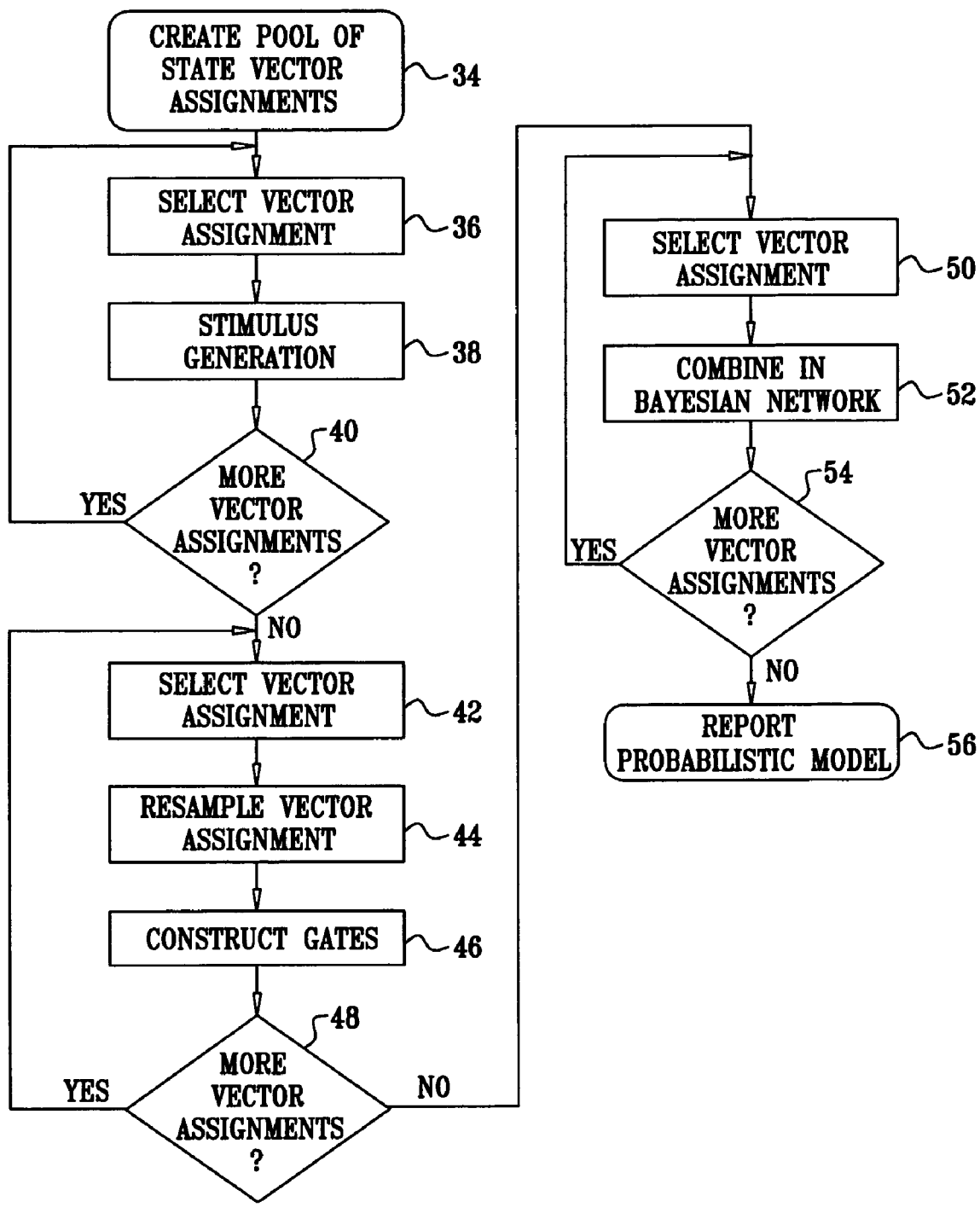
FIG. 3 is a flow chart illustrating a method of machine learning in order to improve the success rate of stimuli generation in accordance with a disclosed embodiment of the invention.

Reference is now made to FIG. 3, which is a flow chart illustrating a method of machine learning in order to improve the success rate of stimuli generation for a design-under-verification in accordance with a disclosed embodiment of the invention. Process steps are shown in a particular sequence in FIG. 3 for clarity of presentation. However, it will be evident that many of them can be performed in parallel or asynchronously.

Stage 1 begins at initial step 34, in which a set of transactions of interest are selected, which are used in the generation of test cases or stimuli for the design-under-verification. A set of state vectors is identified, which forms a universe of possible initial states for a stimuli generator. Sampling of this set is performed in order to generate a subset or sample pool of state vector assignments. The state vector assignments can be random or the result of experimental design.

Next, at step 36 a state vector assignment is chosen from the pool generated at initial step 34.

Next, at step 38 the current state vector assignment is processed using a stimuli generator, and the result (success or failure) is recorded.

Control now proceeds to decision step 40, where it is determined if more state vector assignments need to be processed by the stimuli generator. If the determination at decision step 40 is affirmative, then control returns to step 36.

If the determination at decision step 40 is negative, then control proceeds to step 42, which initiates a sequence comprising Stage 2, where structure induction is performed. At step 42 one of the state vector assignments is again chosen from the pool generated at initial step 34.

Next, at step 44 relevant bits of the current state vector assignment are selected. In step 44, a mechanism is employed that directs a process of resampling to obtain more informative data as to substructures of the state vectors that are outcome determinative. A procedure for resampling is described hereinbelow in further detail.

Next, at step 46, the resampled state vector assignment is grouped into gates. The techniques used to infer the substructures are based on the identification of significant correlations between subsets of the initial state bits and the recorded stimuli generation results (success or failure).

Control now proceeds to decision step 48, where it is determined if more state vector assignments need to be resampled. If the determination at decision step 48 is affirmative, then control returns to step 42.

If the determination at decision step 48 is negative, then control proceeds to step 50, which initiates a sequence that comprises Stage 3, constructing and training a statistical model. At step 50, once again a state vector assignment is chosen from the pool generated at initial step 34.

Next, at step 52 the substructures or gates of the current state vector assignment are combined with other state vector assignments to create a statistical model of the effect of the initial state on generation success. Bayesian networks offer an efficient modeling scheme by providing a compact representation of the complex relationships among the system ingredients, together with the ability to encode essential domain knowledge. Setting the network's numerical parameters can be done in a data-driven manner using the known maximum likelihood (ML) or expectation maximization (EM) training algorithms. These algorithms are known, for example, from the document *Bayesian Networks and Decision Graphs,* F. V. Jensen., Springer, 2001. However, learning the structure of the network is much more difficult, especially when the network incorporates latent variables for which there are no observations in the training set. The structure induction step circumvents this problem by means of a decomposition procedure, from which the Bayesian network's structure is inferred, and which is explained below in Appendix 1.

Control now proceeds to decision step 54, where it is determined if more state vector assignments need to be resampled. If the determination at decision step 54 is affirmative, then control returns to step 50.

If the determination at decision step 54 is negative, then control proceeds to final step 56, where the outcome of the above procedure is reported as a probabilistic model relating each state vector to generation success. This model can be used in a number of ways, most notably to predict whether a given state vector assignment will succeed or fail, and to generate assignments that have a high probability of succeeding. In Bayesian network terminology, "success" evidence is set in a node that approximates the "feasible region", which is explained below, and in nodes that represent the transactions of interest. The nodes that represent the state vector for the most probable explanation (MPE) can be queried. Alternatively, the conditional joint distribution represented by the instantiated Bayesian network can be sampled.

The Feasible Space.

It will be recalled that the feasible space consists of the legal assignments to the state vector. These are determined by the hardware configuration of the design-under-verification, and are independent of the transactions that are being generated. Consequently, the feasible space need be learned only once. Thus, it is beneficial to break the learning problem into two smaller problems: identifying the feasible space and identifying the successful assignments that form a subspace of favorable state vector assignments within the feasible space. By first learning the feasible space, subsequent sampling can be limited to it, thus producing more "success" events. These events are required for the second stage, identifying the successful state vector assignments.

Directed Resampling and Feature Selection.

Random or designed sampling may result in an unbalanced training set, in which labels of one type (typically, failure) dominate the other type (success). The imbalance may be due to poor sampling or simply to the fact that there are very few successful assignments.

This imbalance may cause the learning system to produce a naive solution, i.e., a constant function that always predicts the majority label. If the fraction of minority labels exceeds a desired error rate, a constant function is not acceptable, and the training set must be enhanced. Poor sampling is, in principle, a rare event that can be corrected by simple re-sampling. However, getting a sufficient-amount of successful assignments from a small feasible region represents a greater challenge. To this end, the following simple directed resampling mechanism has been devised. Randomly sample until at least one successful assignment is obtained, or until the estimated measure of successful assignments drops below a predefined error bound. In the former case, proceed to enhance the training set by repeatedly selecting pairs (X;Y) of assignments with opposite labels and traversing the path connecting them, i.e., the sequence of assignments leading from X to Y by flipping one bit (among those on which X and Y disagree) each time. There are $d_H$! such paths, but together they contain only $2d_H$ different assignments), where $d_H$ is the Hamming distance between X and Y. Most paths will yield additional successful assignments. Moreover, by finding neighboring assignments (in the Hamming sense) with conflicting labels, one can easily identify significant bits, thus gaining a simple feature selection mechanism in the process. Other methods of resampling are also possible.

The method disclosed in FIG. 3 has been applied in two different exemplary settings with the objective of improving generation success and coverage in processor and system level generation. In both settings, the proposed method significantly reduced generation failures and enabled faster coverage. Of course, the technique of FIG. 3 is not limited to the specific examples that follow, and many other applications will occur to those skilled in the art.

EXAMPLE 1

The invention has been tested as part of a feed-back-based coverage directed generation (CDG), whose goal is to cover the every-other coverage model for a PowerPC® processor. The CDG system is explained in further detail in the document *Coverage Directed Test Generation for Functional Verification Using Bayesian Networks,* S. Fine and A. Ziv, in Proceedings of the 40th Design Automation Conference, pages 286-291, June 2003. A model, known as the "every-other model", is defined as all possible pairs of consecutive instructions in program order that are executed without exceptions. While the task of generating test programs that cover the every-other model seems easy, this is not the case. In fact, previous attempts to cover the model required several weeks of human effort and hundred of thousands or more tests to cover the model. In many cases, these attempts failed to reach 100% coverage.

The main source of difficulty in generating test programs for the every-other model are exceptions. Therefore, the CDG system was designed to reduce exceptions in the generated test programs. Exceptions can be generated by instructions for a host of reasons: They may be data related, e.g., divide-by-zero, caused by access to illegal or unmapped memory, or caused by the processor being in an inappropriate state, e.g., attempting to execute a privileged instructions in user mode.

The exemplary CDG system was directed mainly to exceptions related to the state of the processor, specifically, the contents of the machine state register (MSR). The CDG system generated test programs aimed at covering holes in the every-other coverage model, while trying to minimize the MSR related exceptions in the test programs, thus maximizing coverage.

Figure 4:
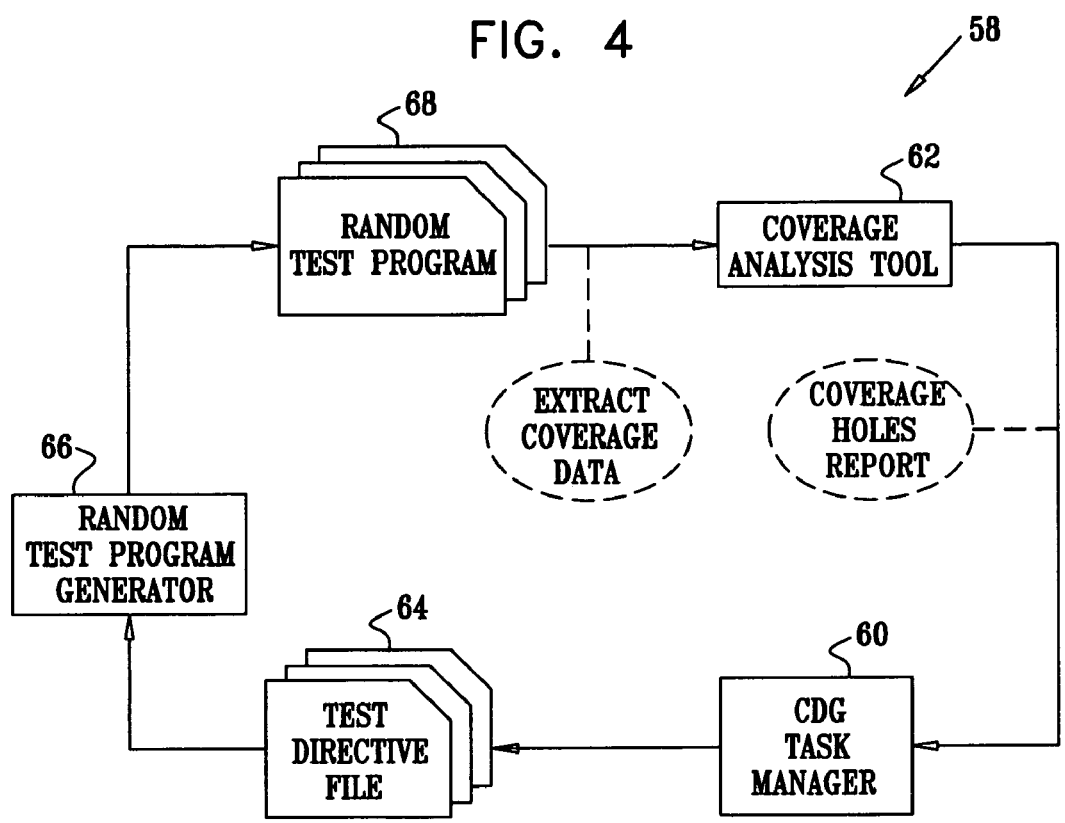
FIG. 4 is a schematic diagram of a coverage directed generation (CDG) system used in an embodiment of the invention.

Reference is now made to FIG. 4, which is a high level schematic diagram of a CDG system 58 that was used in this example. At each iteration, a CDG task manager 60 queries a coverage analysis tool 62 about non-covered events. Hole analysis capabilities of the coverage analysis tool 62 are used to group together related events, thus reducing the number of test directives generated. Hole analysis is described in the document *Hole Analysis for Functional Coverage Data,* O. Lachish, E. Marcus, S. Ur, and A. Ziv, in Proceedings of the 39th Design Automation Conference, pages 806-811, June 2002. For each coverage hole, the CDG task manager 60 used a Bayesian network to generate at least a partial assignment to the MSR that minimizes exceptions for the instructions in the hole. The CDG task manager 60 used this assignment to generate test directive files 64 that attempted to cover the hole. The generated test directive files 64 were fed into a random test generator 66 that generated respective random test programs 68 for each of the test directive files 64. In this example the random test generator 66 was Genesys-Pro, which is described in the document *Genesys-Pro: Innovations in Test Program Generation for Functional Processor Verification,* A. Adir, E. Almog, L. Fournier, E. Marcus, M. Rimon, M. Vinov, and A. Ziv, IEEE Design and Test of Computers, 21(2):84-93, 2004. Coverage information was extracted from the random test programs 68 and fed into the coverage analysis tool 62, which updated the coverage state. This process repeated itself until 100% coverage was reached.

The construction and training of the Bayesian network in the CDG task manager 60 followed the procedure described above. More particularly, one common Bayesian network was constructed, which captured the feasible space of MSR values. For each PowerPC instruction, a Bayesian network was constructed that captured the relation between the value of the MSR and the generation of exceptions for that instruction. The final step was to combine all the Bayesian networks into one large Bayesian network.

Figure 5:
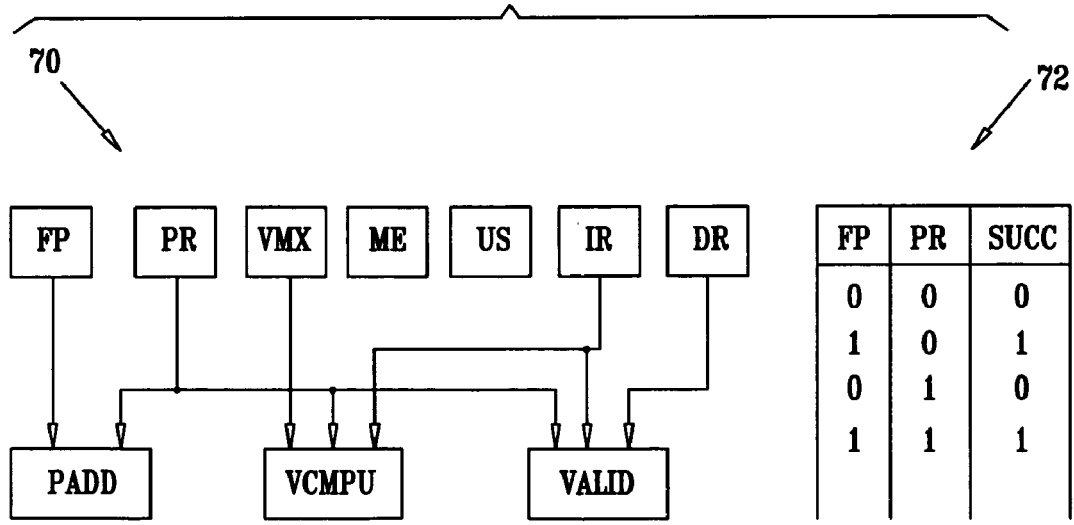
FIG. 5 illustrates a portion of a Bayesian network that was produced by the system shown in FIG. 4 in accordance with a disclosed embodiment of the invention.

Reference is now made to FIG. 5, which illustrates a portion of a final Bayesian network that was produced by this Example in accordance with a disclosed embodiment of the invention. A diagram 70 at the left side of the figure shows the relation between several instructions and MSR bits. A truth table 72 at the right side applies to a function relating the MSR bits and the fadd instruction. The truth table 72 is an approximation of the probabilistic relations captured by the Bayesian network.

Referring again to FIG. 4 and FIG. 5, to operate the resulting Bayesian network, the CDG task manager 60 sets values in the nodes of the diagram 70 that are related to the relevant instructions, i.e., instructions that are in a coverage hole, to the value 1 in order to indicate test generation without causing an exception. Next, it queries the Bayesian network for the most probable explanation (MPE) that leads to this assignment. The result of the query is the setting of the MSR to a state that has the highest probability of generating the requested instructions without exceptions.

The CDG system 58 has been applied to generate test programs that cover the every-other model in two PowerPC designs. In both cases, the system was able to construct the Bayesian network automatically, describing the relation between the value of the MSR and exception generation for all the instructions. With the CDG system, 100% coverage was attained in about 24 hours using less than 7000 test programs, compared with several weeks and hundreds of thousands of test programs resulting in less than 100% coverage in previous attempts using conventional methods. The test programs generated by the CDG system 58 revealed several flaws in the designs.

EXAMPLE 2

The above-described method was applied using X-Gen, a system level test generator, which is described in the document *X-Gen: A Random Test-case Generator for Systems and SoCs,* R. Emek, I. Jaeger, Y. Naveh, G. Bergman, G. Aloni, Y. Katz, M. Farkash, I. Dozoretz, and A. Goldin, in IEEE International High Level Design Validation and Test Workshop, pp 145-150, October 2002. Three experiments of increasing complexity were conducted.

In each of the first two experiments, a request file was selected and it was attempted to improve X-Gen's success rate on it. The X-Gen system was tested in two modes of interaction: (1) generation mode, in which X-Gen generated assignments that were expected to succeed; (2) filter mode, in which X-Gen generated assignments, after which those expected to fail were rejected. Table 1 shows, for each experiment, the success rate when X-Gen was run freely in a conventional mode of operation, lacking the adaptations according to the invention, and when adapted according to the invention in each of the interaction modes. Coverage information for each interaction mode is also provided in Table 1. The table entries represent the fraction of actually successful assignments that the inventive method produced in generation mode or predicted as successful in filter mode. As can be seen, in all cases except one (Experiment 1, Generation Mode) the success rate was significantly improved as compared with conventional X-Gen operation.

TABLE 1

| Exp. | Freely succ. | Generation Mode | | Filter Mode | |
|---|---|---|---|---|---|
| | | succ. | cov. | succ. | cov. |
| 1 | 77% | 46% | 94% | 100% | 97% |
| 2 | 14% | 75% | 100% | 100% | 97% |
| 3 | 3% | 79% | 46% | 75% | 39% |

Details of the third experiment, which was the most challenging among the three, are now described. In this experiment, a single InfiniBand multicast transaction was requested. Infiniband specifications are available from the InfiniBand Trade Association Administration, 5440 SW Westgate Drive, Suite 217 Portland Oreg., 97221. The request could only be satisfied by configuring certain Infiniband adapter bridge registers for sending and receiving multicast.

The complexity of the problem in this experiment was considerably greater than in the first two experiments because the pool of bits was significantly larger, and each execution of X-Gen took much longer, approximately five minutes, making the sampling process very costly.

The pool contained 24 bits. Four of them were discovered to have fixed values within the feasible subspace of initial states, thus reducing the pool size to 20. A data set of approximately 600 assignments was generated, of which only 30 were successful. To boost the number of successful samples directed resampling was employed, which also aided in identifying bits correlated with the result. As a result, approximately 1200 samples were realized, about half of which were in the feasible subspace. Of these samples, 143 were successful. The data set was fed to the above-described learning procedure, and it rejected eight bits as being irrelevant. Using the remaining 12 bits, two probabilistic models were constructed, describing the feasible space and the success/failure bit within the feasible space. To evaluate performance in Generation Mode X-Gen was run once on each of the 4096 possible assignments to the 12 bits, in order to determine which were successful and which were not. Then X-Gen was run freely (conventionally) 1000 times to obtain statistics for X-Gen in conventional mode and for filter mode.

Alternative Embodiments

Other methods can be used to control and generate partial assignments of an initial state bit vector in order to allow (enhance) the generation of subsequent transactions, for example, neural networks, decision trees, or support vector machines.

Additional Capabilities.

From a practical standpoint, the inventive systems and methods can be used in a number of ways. One approach, which was used in the every-other coverage settings, is to create a knowledge base of pre-learned functions, which represent selected transactions, and construct composite models that handle various sets of directives. Another possibility is to construct a predictor function on-the-fly, for each set of directives separately. In this setting, a process of sampling (i.e., running the CSP solver many times) must be performed for each new setting. Thus, it makes sense to activate this approach in conjunction with a traditional CSP solver, such that a transition to the learning system is made only when the solver fails to efficiently handle a specific set of directives.

These methods disclosed above can be readily extended by those skilled in the art to affect favorably the generation of transactions by controlling and affecting the state vector of the DUV and the verification environment at a point in the generation sequence that precedes some generated transactions rather than at the beginning of the sequence. For example, if a memory access transaction requires specific access privileges to complete successfully, the stimuli generator may insert a transaction that modifies the access privileges (which are part of the state vector) to a favorable setting prior to the generation of the memory access transaction instead of setting this favorable state in the initial state.

Appendix 1

Inverted Tree Structure Learning.

Consider the problem where we are given an oracle that computes a function F of the following type. The function is defined on a vector $X=(x_1, \ldots, x_n)$ of n=kd variables. These variables are partitioned into k disjoint subsets $X_1, \ldots X_k$ of d variables each. For each $1 \leq i \leq k$, there is a Boolean function $g_i: \{1, -1\}^d \to \{1, -1\}$, and there is an additional function $f:\{1, -1\}^k \to \{1, -1\}$. The function F is defined by: $F(X)=f(g_1(X_1),g_2(X_2), \ldots, g_k(X_k))$. Such a function can be modeled by an inverted tree network (see FIG. 5), in which the source nodes correspond to the $x_i$ variables, the nodes in the intermediate level represent the functions $g_i$ such that all the variables in the set $x_i$ are connected to the functions $g_i$, respectively, and the sink node corresponds to the function f. The structure learning problem is as follows. We know that the function F has the above structure, but we do not know the functions f, $g_1 \ldots g_k$, nor do we know which variables belong to which set $X_i$. Our goal is to infer which variables belong to which sets by querying the oracle for F. The parameters of the problem are k and d.

In this section, a correlation-based technique is described for approximately solving the structure learning problem. Although we have posed the problem as one in which the sets $X_i$ are disjoint, in practice our method of solution generates sets that are not necessarily disjoint. Moreover, our method allows k to be greater than n/d, and the sets generated by our method may contain fewer than d variables, but not more.

Our technique follows: using a labeled data set, we estimate all correlation coefficients containing at most d variables and the result bit (the value of the F function). We sort the coefficients by decreasing weight and drop all coefficients whose weights are below some threshold (we used $10^{-6}$). We then traverse the sorted list $c_1, c_2, \ldots$, until the first coefficient $c_i$ such that the number of different variables contained in $c_1$ through $c_{i+1}$ exceeds d. We take the variables contained in $c_1, \ldots, c_i$ to be the set $X_1$. In a similar manner, we then determine $X_2$ (starting at $c_{i+1}$), then $X_3$, etc., until we reach $X_k$ (or until we exhaust the list). Experimental evidence findings lend credence to our technique by which the significant ("heavy") correlation coefficients are used to indicate the correct grouping of variables.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

The invention claimed is:

1. A method for functional verification of a design, comprising the steps of:
   identifying a feasible space of initial state vectors that can enable generation of stimuli for said design;
   sampling said feasible space to obtain a sample pool of initial state vectors;
   generating test stimuli to stimulate said design using respective members of said sample pool;
   evaluating results of an application of said test stimuli;
   responsively to said step of evaluating, establishing a subspace of said feasible space, said subspace comprising favorable initial state vectors; and
   selecting new initial state vectors from said subspace for use in generating functional tests for said design.

2. The method according to claim 1, further comprising the step of identifying outcome determinative substructures within said initial state vectors.

3. The method according to claim 2, wherein said step of identifying outcome determinative substructures is performed by resampling said members of said sample pool.

4. The method according to claim 2, further comprising the steps of:
   grouping said outcome determinative substructures into gates; and
   creating a statistical model from said gates that correlates said step of evaluating with initial states of said gates.

5. The method according to claim 4, wherein said statistical model is a Bayesian network.

6. The method according to claim 1, wherein said initial state vectors have structures comprising a plurality of bits.

7. The method according to claim 1, wherein said initial state vectors comprise state vectors that are assigned at a point in a generation sequence subsequent to a beginning of said sequence.

8. The method according to claim 1, wherein said feasible space of initial state vectors comprises a space of user requests.

9. A computer software product, including a computer-readable medium in which computer program instructions are stored, which instructions, when read by a computer, cause the computer to perform a method for functional verification of a design, comprising the steps of:
   identifying a feasible space of initial state vectors that can enable generation of stimuli for said design;
   sampling said feasible space to obtain a sample pool of initial state vectors;
   generating test stimuli to stimulate said design using respective members of said sample pool;
   evaluating results of an application of said test stimuli;
   responsively to said step of evaluating, establishing a subspace of said feasible space, said subspace comprising favorable initial state vectors; and
   selecting new initial state vectors from said subspace for use in generating functional tests for said design.

10. The computer software product according to claim 9, wherein said initial state vectors have structures comprising a plurality of bits.

11. The computer software product according to claim 9, wherein said computer is further instructed to perform the step of identifying outcome determinative substructures within said initial state vectors.

12. The computer software product according to claim 11, wherein said step of identifying outcome determinative substructures is performed by resampling said members of said sample pool.

13. The computer software product according to claim 11, wherein said computer is further instructed to perform the steps of:
   grouping said outcome determinative substructures into gates; and
   creating a statistical model from said gates that correlates said step of evaluating with initial states of said gates.

14. The computer software product according to claim 11, wherein said initial state vectors comprise state vectors that are assigned at a point in a generation sequence subsequent to a beginning of said sequence.

15. A verification system for functional verification of a design, comprising:
   a random test generator;
   a constraint satisfaction problem engine, cooperative with said random test generator to perform the steps of:
      identifying a feasible space of initial state vectors that can enable generation of stimuli for said design;
      sampling said feasible space to obtain a sample pool of initial state vectors; and
      generating test stimuli to stimulate said design using respective members of said sample pool;
   an execution engine for stimulating said design using said test stimuli;
   a coverage analyzer operative for evaluating results of said execution engine, said constraint satisfaction problem engine, and said random test generator being cooperative, with said coverage analyzer for establishing a subspace of said feasible space, said subspace comprising favorable initial state vectors; and selecting new initial state vectors from said subspace for use in generating functional tests for said design.

16. The verification system according to claim 15, wherein said initial state vectors have structures comprising a plurality of bits.

17. The verification system according to claim 15, wherein said constraint satisfaction problem engine, and said random test generator are cooperative for identifying outcome determinative substructures within said initial state vectors.

18. The verification system according to claim 17, wherein identifying outcome determinative substructures comprises resampling said members of said sample pool.

19. The verification system according to claim 17, wherein said constraint satisfaction problem engine, and said random test generator are cooperative for performing the steps of:
grouping said outcome determinative substructures into gates; and
creating a statistical model from said gates that correlates said step of evaluating with initial states of said gates.

20. The verification system according to claim 19, wherein said statistical model is a Bayesian network.

* * * * *